US012167590B2

(12) United States Patent
Horch

(10) Patent No.: US 12,167,590 B2
(45) Date of Patent: Dec. 10, 2024

(54) ONE-TRANSISTOR (1T) ONE-TIME PROGRAMMABLE (OTP) ANTI-FUSE BITCELL WITH REDUCED THRESHOLD VOLTAGE

(71) Applicant: Synopsys, Inc., Mountain View, CA (US)

(72) Inventor: Andrew Edward Horch, Seattle, WA (US)

(73) Assignee: Synopsys, Inc., Sunnyvale, CA (US)

( * ) Notice: Subject to any disclaimer, the term of this patent is extended or adjusted under 35 U.S.C. 154(b) by 410 days.

(21) Appl. No.: 17/544,583

(22) Filed: Dec. 7, 2021

(65) Prior Publication Data

US 2022/0189973 A1  Jun. 16, 2022

Related U.S. Application Data

(60) Provisional application No. 63/125,907, filed on Dec. 15, 2020.

(51) Int. Cl.
*H10B 20/20* (2023.01)
*G11C 17/16* (2006.01)
*G11C 17/18* (2006.01)
*H01L 23/525* (2006.01)

(52) U.S. Cl.
CPC .......... *H10B 20/20* (2023.02); *G11C 17/165* (2013.01); *G11C 17/18* (2013.01); *H01L 23/5252* (2013.01)

(58) Field of Classification Search
CPC ............ H10B 20/20–25; G11C 17/165; G11C 17/18; H01L 23/5252; H01L 23/5256; H01L 23/525
See application file for complete search history.

(56) References Cited

U.S. PATENT DOCUMENTS

| | | | |
|---|---|---|---|
| 2012/0182782 A1* | 7/2012 | Kurjanowicz | G11C 17/18 365/94 |
| 2014/0035014 A1* | 2/2014 | Jeon | H01L 29/42368 257/296 |
| 2014/0209989 A1* | 7/2014 | Kurjanowicz | H10B 20/20 438/281 |
| 2021/0158881 A1* | 5/2021 | Chen | G11C 17/16 |

* cited by examiner

*Primary Examiner* — Evan G Clinton
(74) *Attorney, Agent, or Firm* — Andrew L. Dunlap; Haynes Beffel & Wolfeld LLP

(57) ABSTRACT

A one-transistor (1T) one-time programmable (OTP) anti-fuse bitcell is provided. The 1T OTP anti-fuse bitcell includes a gate, a diffusion region including at least two sub-regions, and a gate oxide region located between the gate and the diffusion region, the gate oxide region including a thin gate oxide region and a thick gate oxide region.

19 Claims, 10 Drawing Sheets

ONE-TRANSISTOR (1T) ONE-TIME PROGRAMMABLE (OTP) ANTI-FUSE BITCELL WITH REDUCED THRESHOLD VOLTAGE

CROSS REFERENCE TO RELATED APPLICATIONS

This application claims priority under 35 U.S.C. § 119(e) to U.S. Provisional Application No. 63/125,907 filed Dec. 15, 2020, entitled "One Time Programmable Anti-Fuse Bitcell with Narrow Width to Reduce Voltage Threshold", the entire contents of which is hereby incorporated by reference in its entirety.

TECHNICAL FIELD

The present disclosure generally relates to an electronic circuit device. In particular, the present disclosure relates to a one transistor (1T) one-time programmable (OTP) anti-fuse bitcell with reduced voltage threshold (VT).

BACKGROUND

One-time programable (OTP) bitcells can be implemented to use a single transistor. These OTP bitcells are called one transistor (1T) OTP bitcells. Further, 1T OTP bitcells can be of a fuse type or an anti-fuse type. A fuse-type 1T OTP bitcell (i.e., a 1T OTP fuse bitcell) starts with a low resistance read/write (electrically conductive) path and is designed to permanently break the low resistance read/write (electrically conductive) path when current exceeds a limit. As a result, the low resistance read/write path is destroyed leaving an open circuit. An anti-fuse type 1T OTP bitcell (i.e., a 1T OTP anti-fuse bitcell) starts with a high resistance read/write path that converts to a low resistance read/write path when current exceeds a limit. A 1T OTP anti-fuse bitcell is programmed by applying the current that exceeds the limit to create the low resistance electrically conductive read/write path.

As mentioned above, 1T OTP bitcells (fuse or anti-fuse) only use a single transistor with a single gate. The single gate supports two gate oxide thicknesses, including a thick input/output (IO) gate oxide portion and a thin core gate oxide portion. The thin core gate oxide portion is used to program the 1T OTP bitcell by applying a desired current.

SUMMARY

In an embodiment the present disclosure incudes a one-transistor (1T) one-time programmable (OTP) anti-fuse bitcell is provided. The 1T OPT anti-fuse bitcell can include a gate, a diffusion region including at least two sub-regions, the at least two sub-regions being isolated from one another at one or more locations, and a gate oxide region located between the gate and the diffusion region, the gate oxide region including a first gate oxide region and a second gate oxide region, wherein the first gate oxide region has a thinner thickness than the second gate oxide region.

In another embodiment, each sub-region of the at least two sub-regions can be shorted to the thin gate oxide region.

In a further embodiment, the 1T OTP anti-fuse bitcell can be programmed by an application of a voltage sufficient to cause a rupture in the thin gate oxide region.

In an embodiment, each sub-region of the at least two sub-regions can be shorted to contact a bit line.

In another embodiment, a width of a first sub-region of the at least two sub-regions can be narrower than a width of a second sub-region of the at least two sub-regions.

In a further embodiment, the at least two sub-regions of the diffusion region can include a third sub-region and a width of the third sub-region can be narrow enough to affect the threshold voltage of the 1T OTP anti-fuse bitcell during a read operation.

In an embodiment, the at least two sub-regions of the diffusion region can include a third sub-region and a width of the third sub-region can be narrower than the width of the second sub-region.

In another embodiment, the width of the first sub-region can be the same as the width of the third sub-region and the width of each of the first and third sub-regions can be less than the width of the second sub-region.

In a further embodiment, the 1T OTP anti-fuse bitcell can be programmed by an application of a voltage sufficient to cause a rupture in the thin gate oxide region, such that each sub-region of the at least two sub-regions is shorted to the thin gate oxide region.

In an embodiment, each sub-region of the at least two sub-regions can be shorted to contact a bit line.

In another embodiment the at least two sub-regions can be formed in the diffusion region by forming one or more slots in the diffusion region along a partial length of the diffusion region, such that a first slot is located and extends between lengths of the at least two sub-regions.

In a further embodiment, the at least two sub-regions can include three sub-regions, the one or more slots can include first and second slots, and a width of at least one of the first and second slots can be wider than a width of at least one of the three sub-regions.

In an embodiment, the at least two sub-regions can include three sub-regions, the one or more slots can include first and second slots, and a length of at least one of the first and second slots can be the same as a length of at least one of the three sub-regions.

In another embodiment a total combined width of the at least two sub-regions can be sufficient to provide enough current during a rupture of the thin gate oxide region to form a permanent low resistance filament therein.

In a further embodiment, first and second sub-regions of the at least two sub-regions can be formed in the diffusion region by forming a slot in the diffusion region along a partial length of the diffusion region, such that the slot is located and extends between lengths of the first and second sub-regions.

In an embodiment, a width of the slot can be wider than a width of the first sub-region.

In another embodiment, a length of the slot can be the same as a length of at least one of the first and second sub-regions.

In a further embodiment, a bipolar complementary metal-oxide-semiconductor double-diffused metal-oxide-semiconductor (BCD) chip is provided. The BCD chip can include a row of one-transistor (1T) one-time programmable (OTP) anti-fuse bitcells, each pair of 1T OTP anti-fuse bitcells of the row sharing a common bitline, and each 1T OTP anti-fuse bitcell of the row including a gate, a diffusion region including at least two sub-regions, the at least two sub-regions being isolated from one another at one or more locations, and a gate oxide region located between the gate and the diffusion region, the gate oxide region including a thin gate oxide region and a thick gate oxide region.

In another embodiment, for each respective 1T OTP anti-fuse bitcell of the row of the BCD chip, a width of a first sub-region of the at least two sub-regions can be narrower than a width of a second sub-region of the at least two sub-regions.

In an embodiment, a method of manufacturing a one-transistor (1T) one-time programmable (OTP) anti-fuse bitcell is provided. The method can include forming a diffusion region including at least two sub-regions, the at least two sub-regions being isolated from one another at one or more locations, forming a gate oxide region over the diffusion region, the gate oxide region including a thin gate oxide region and a thick gate oxide region, and forming a gate over the gate oxide region.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Figure 1:
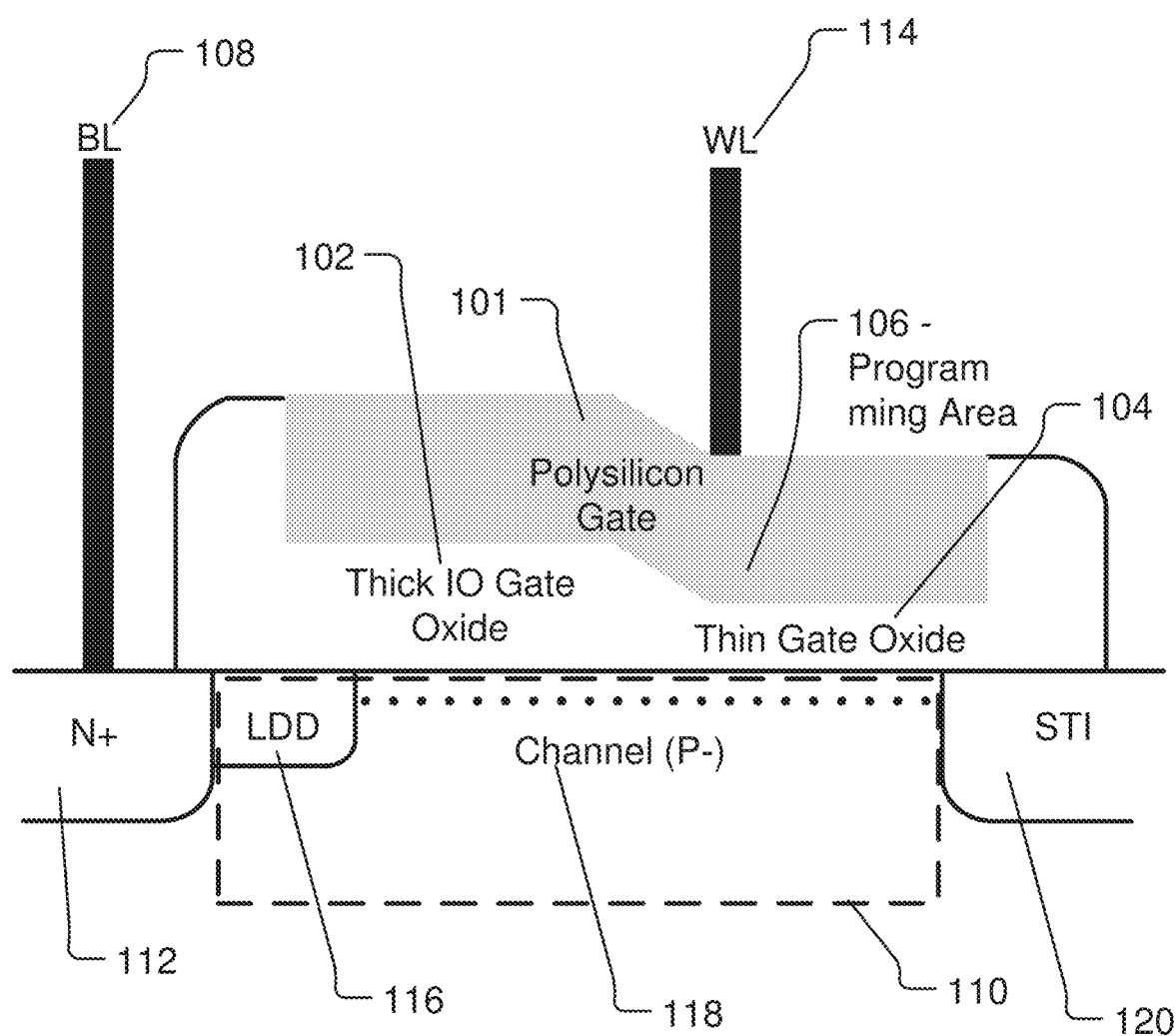
FIG. 1 illustrates a cross-section view of a one-transistor (1T) one-time programmable (OTP) anti-fuse bitcell having a thick gate oxide portion and a thin gate oxide portion.

Aspects of the present disclosure relate to a one-transistor (1T) one-time programmable (OTP) anti-fuse bitcell having a multi-finger diffusion region to reduce the voltage threshold, where multi-finger refers to splitting a diffusion region into multiple diffusion regions or sub-regions that are separated and/or insulated from one another at one or more points.

A 1T OTP anti-fuse bitcell (or memory) has an advantage over a two transistor (2T) OTP anti-fuse bitcell, such that the 1T OTP bitcell only requires one gate and only requires one signal from the row logic, as opposed to the 2T OTP bitcell which requires two gates and two signals from the row logic. As a result, the bitcell itself can be smaller along with the peripheral logic.

However, the 1T OTP anti-fuse bitcell requires a thick gate input/output (IO) oxide region and a thin gate core region below the gate. The thick gate oxide region of the 1T OPT anti-fuse bitcell sets the threshold voltage (VT) of the bitcell. The thin gate oxide portion of the bitcell limits the maximum voltage that can be put across the bitcell gate during a read operation so as to avoid any damage during the read. The high VT from the thick gate oxide portion can combine to limit the minimum voltage the bitcell can be read at.

There is an increasing demand for 1T OTP bitcells in bipolar complementary metal-oxide-semiconductor double-diffused metal-oxide-semiconductor (BCD) processes. Common uses for BCD prosses are technologies for controlling displays, power management and micro-electromechanical system (MEMS) controllers, which are designed to have a very large operational voltage range. This makes the use of the 1T OTP bitcell difficult because of the high VT and the maximum voltage at which the 1T OTP bitcell can be read from. For example, a liquid crystal display (LCD) driver chip has pairs of devices that operate at 1 volt (1V), 8 volts (8V) and 30 volts (30V) (i.e., 3 pairs of devices, 6 devices total in the LCD driver chip). The above-described LCD driver chip is just an example, other 28 mm display drivers can operate at 1.2 volts, 8 volts and 32 volts. Other common uses for BCD processes are micro-electromechanical system (MEMS) controllers and power management.

Turning back to the LCD display driver example, display drivers are used to control flat panel displays in smart phones, computer monitors, and televisions. Flat panel displays are commonly made with thin film transistors. These thin film transistors are made on glass substrates typically operating at voltages around 30V. A BCD process optimized for display drivers typically has double-diffused metal-oxide-semiconductor (DMOS) devices (e.g., 30V devices) to drive the display, standard complementary metal-oxide-semiconductor (CMOS) logic devices (e.g., 1V devices) for logic computation, bridge devices (e.g., 8V devices) used both to step the output of the logic device voltage up to a voltage that can switch the DMOS devices, and non-volatile memory. The bridge devices are typically CMOS devices with thicker gate oxide. The bridge devices are also used for chip-to-chip IO. The non-volatile memory can include the above-mentioned 1T OTP anti-fuse bitcells. The non-volatile memory is used to store configuration settings, analog trim values, and correction settings. The configuration settings can be used to define which display the LCD driver chip is driving. This allows for one display driver chip to be used for many different display screens. The configuration setting can include analog trim settings that can be used to compensate for manufacturing variation in the display. For example, if a display has one color that is a little weak, the display driver can be compensated by making that color a little brighter. This is also known as gamma correction. The configuration settings can also include correction settings that can be used to compensate for bad pixels in a display. If there is a defective pixel that will not turn on, it can be masked by making the adjacent pixels brighter.

As mentioned above, one example of a display driver BCD process might have 1V CMOS core logic devices, 8V CMOS bridge devices, 30V DMOS devices and 1T OTP anti-fuse bitcells acting as non-volatile memory. 1T OTP anti-fuse bitcells can have a problem when there is a difference between the low voltage devices (e.g., 1V core logic devices) and the bridge devices (e.g., 8V devices). In this example, if the display driver chip is used in a mobile battery powered product there is usually a desire to have the memory operate at low voltage. So, the 1V power supply might be expected to drop down to 0.9V. A 1T OTP bitcell typically uses the thin (low voltage) gate oxide for the fuse portion (i.e., the read/write) of the bitcell and the thick gate oxide for the bridge devices or other select devices. The VT of the bitcell is set by the thick gate oxide portion. 8V CMOS devices typically have a VT of around ~1V, meaning that 1V is needed from gate to well to produce a significant drain to source current, and 1V logic devices typically have reliability problems with reads where the gate oxide stress is greater than 1V, meaning that when operated at over their device rating for a long time the gate can be damaged. Gate damage can cause an unprogrammed anti-fuse to become programmed This results in a very small operating window because the 1V VT of the 1T OTP bitcell requires 1V for a read operation and some designs need to operate at low voltages to achieve low power. This small operating window can be solved either with a typical circuit solution (i.e., using circuitry connected to the device driver chip) or with a device solution (i.e., modifying the 1T OPT bitcells of the device driver chip). Such a typical circuit solution involves increasing the gate voltage by either boosting the VDD supply or by regulating down a higher power supply to ensure the gate voltage is not too low for performing a read operation or too high, resulting in damage to the gate or other portions of the chip. The typical circuit solution increases area and has relatively higher power consumption.

The present disclosure describes the reduction of the VT required for a read operation of a 1T OTP anti-fuse bitcell by implementing a multi-finger diffusion region as opposed to a one-finger diffusion region to improve low voltage read. Technical advantages of the present 1T OTP anti-fuse bitcell includes a reduced VT such that the bitcell is read at a relatively lower voltage.

FIG. 1 illustrates a cross-section view of a 1T OTP anti-fuse bitcell having a thick gate oxide portion and a thin gate oxide portion.

Specifically, FIG. 1 illustrates a 1T OTP bitcell 100 that has a gate oxide region having two thicknesses. The 1T OTP bitcell 100 includes a polysilicon gate 101. The gate oxide region is below the polysilicon gate 101. The gate oxide region can be a dielectric layer that separates the polysilicon gate 101 from the source/drain terminal(s) (e.g., in this case, the bitline BL 108). The BL 108 is an electrical connection that can connect a drain 112 (e.g., an N+ drain) of the 1T OTP bitcell 100 to peripheral logic (e.g., column logic for reading and writing from/to the 1T OTP bitcell 100). The gate oxide region below the polysilicon gate 101 includes a thick IO gate oxide (region) 102 and a thin core gate oxide (region) 104. The thick IO gate oxide 102 acts as a select device and the thin core gate oxide 104 allows programming area 106 to be programmed (i.e., the anti-fuse that can be programmed and then read from). Specifically, the thin core gate oxide 104 is used for programming (e.g., breaking down) the programming area 106 of the polysilicon gate 101. As illustrated, the 1T OTP bitcell 100 includes a bitline (BL) 108, a wordline (WL) 114, the N+ doped drain region 112, a lightly doped drain (LDD) 116, a P– doped channel 118, shallow trench isolation (STI) 120, and a diffusion region 110. The diffusion region 110 can include, but not limited to, the P– doped channel 118.

As discussed above, the voltage threshold (VT) of the bitcell is set by the thick IO gate oxide. Devices are commonly designed to operate at a target voltage (e.g., +/–10%). So, a 1V device is expected to operate from 0.9V to 1.1V. The 8V CMOS devices typically have a VT) of around 1V and 1V logic devices typically have reliability problems with long term operation greater than 1.1V. For example, the life of a bitcell can be reduced if read operations are consistently performed at more than 1.1V. An example bitcell could have a lifespan of 10 years. However, if read operations are consistently over 1.1V, then the life of the bitcell could be reduced to less than 10 year as a result of current leak due to damage caused by the consistent read operations above 1.1V. This results in a very small operating window of a target voltage for a read operation being at or above the 1V VT, but not greater than 1.1V where damage can start to occur. For example, it can be difficult to read the 1T OTP bitcell 100 that has a VT of around 1V with 1V required on the gate for reading. Some low power products operate at reduced voltages. If a 1V/8V 1T OTP bitcell is read below 1V there might not be enough current to correctly sense a programed (ruptured) bitcell.

The cross-section view of the 1T OTP in FIG. 1 does not illustrate the one-finger diffusion region configuration or the multi-finger diffusion region configuration mentioned above. However, FIG. 2 illustrates the one-finger diffusion region configuration and FIG. 3 illustrates the multi-finger diffusion region configuration.

Figure 2:
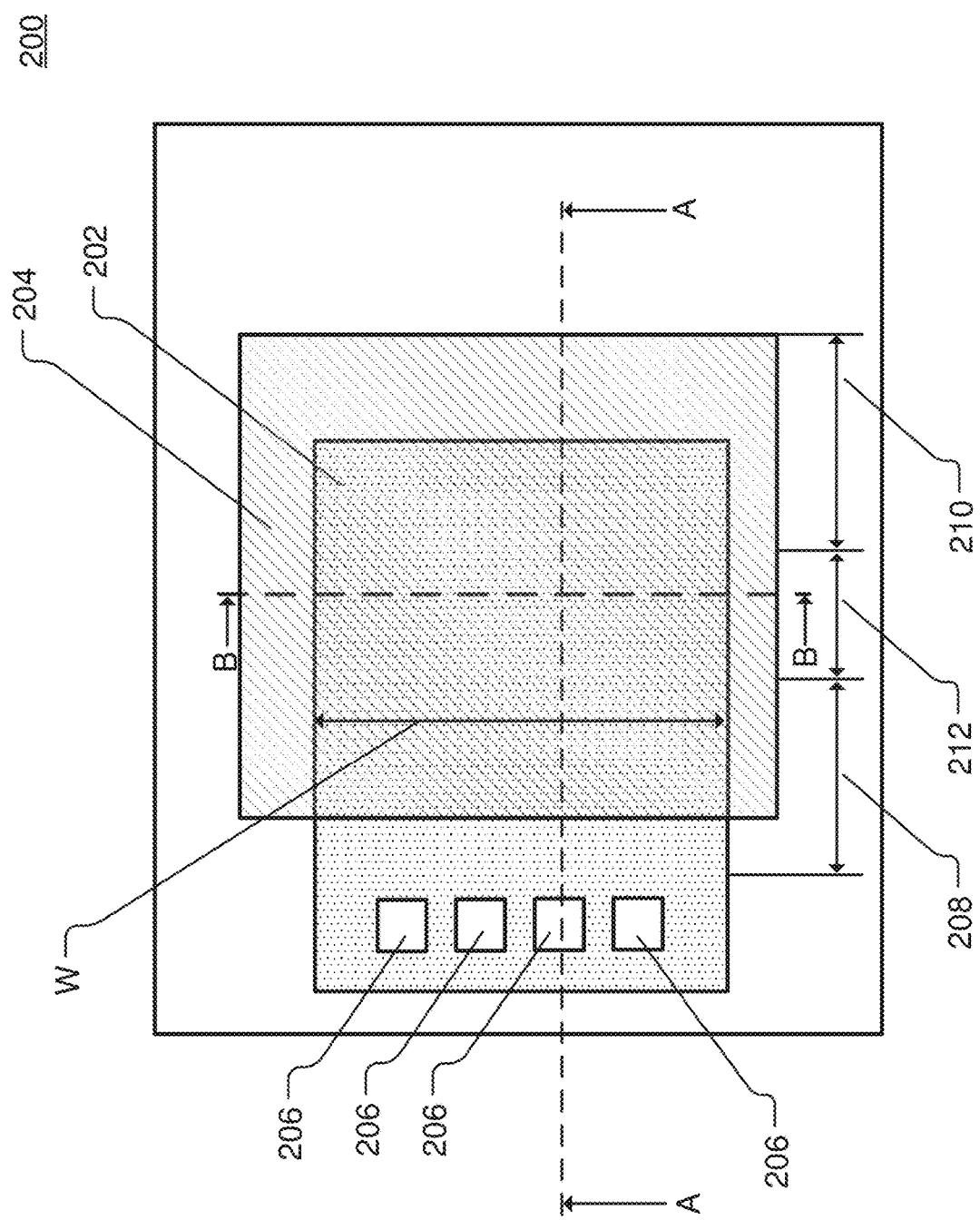
FIG. 2 illustrates an overhead view of a 1T OTP anti-fuse bitcell with a single-finger diffusion region.
Figure 3:
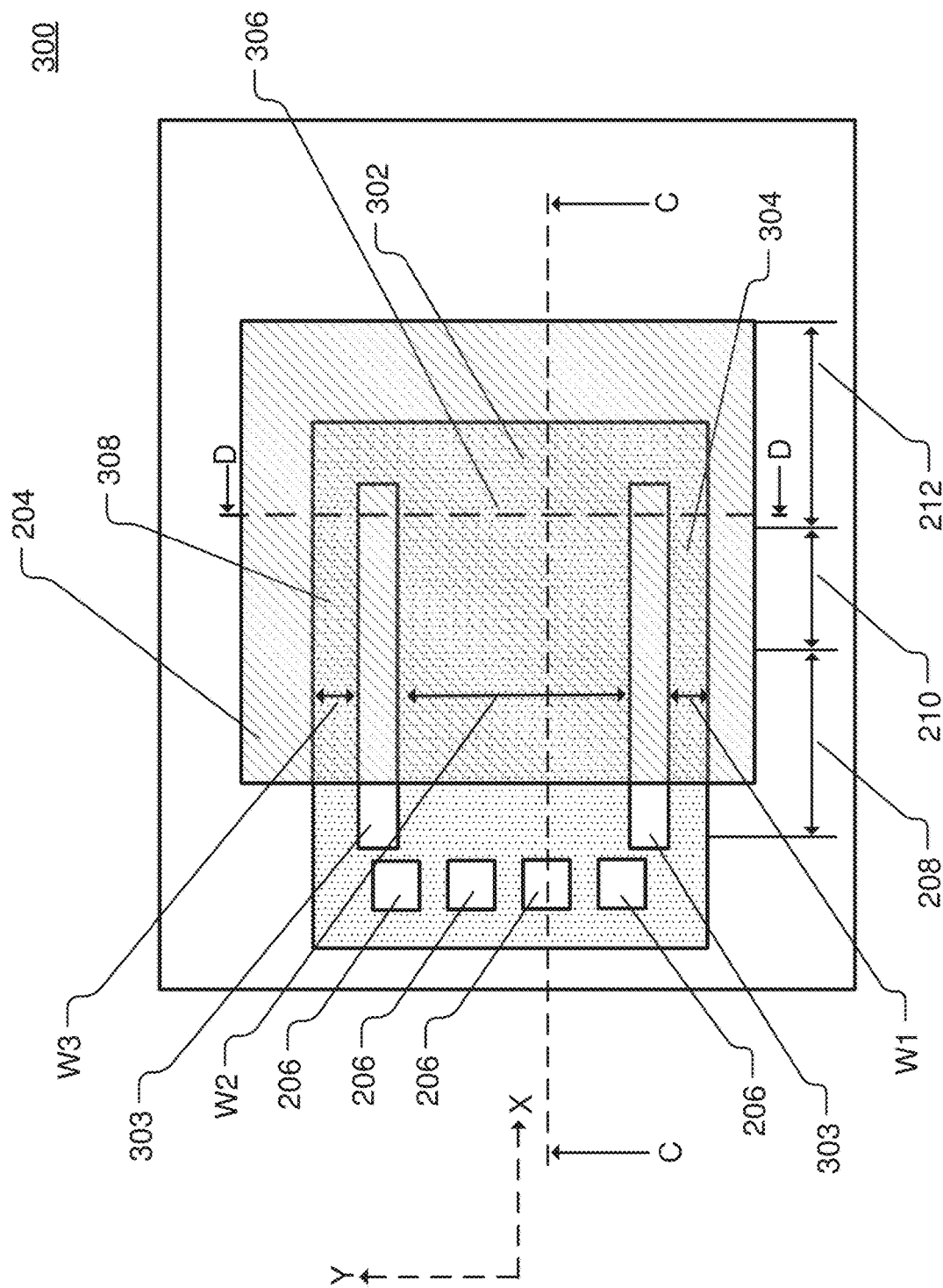
FIG. 3 illustrates an overhead view of a 1T OTP anti-fuse bitcell with a multi-finger diffusion region according to an embodiment of the present disclosure.

FIG. 2 illustrates an overhead view of a 1T OTP anti-fuse bitcell with a single-finger diffusion region.

Specifically, FIG. 2 illustrates a 1T OTP anti-fuse bitcell 200 that includes a one-finger diffusion region 202, a polysilicon gate 204 above the diffusion region 202, and bit lines 206 connected to the diffusion region 202. The bit lines 206 can also be connected to column logic. The one-finger diffusion region 202 includes a semiconductor wafer substrate, with shallow trench isolation dielectric separating it from other bitcells on 3 sides.

FIG. 2 further illustrates a region 208 (below the polysilicon gate 204) that includes the thick IO gate oxide 102 of FIG. 1, a region 210 (below the polysilicon gate 204) that includes the thin core gate oxide 104 of FIG. 1 and a transition region 212 where the polysilicon gate 204 transitions from a higher position to accommodate for the thick IO gate oxide 102 to a lower position to accommodate for the thin core gate oxide 104, as illustrated in FIG. 1. Note that FIG. 1 can be a cross-section taken from line A-A of FIG. 2. The locations of regions 208, 210 and 212 will be clearer when considering, in view of FIG. 1, region 208 that includes the thick IO gate oxide 102, region 210 that includes the thin core gate oxide 104 and transition region 212 that includes a portion where the thick IO gate oxide 102 transitions to the thin core gate oxide 104.

As an example, the one-finger 1T OTP bitcell of FIG. 2 can be implemented in a 28 nm 1.2V/8V/32V display driver process. As mentioned above, the 1T OTP bitcell can have a thick IO gate oxide (e.g., 8V) in region 208 to act as a select device and a thin core gate oxide (e.g., 1.2V) in region 210 for programming The size of the 1T OTP bitcell 200 is larger than needed to pitch match the 1T OTP bitcell to row and column logic. OTP anti-fuse bitcells that program bits by rupturing the gate oxide need to run enough current through the filament formed during rupture to form a permanent low resistance filament. This high current during rupture requirement can cause either the bitcell or peripheral circuits to be large enough to supply the needed current. The width (W) of the bitcell may need to be larger than the minimum width allowed, or the interconnect may need to be larger than the minimum allowed to reduce the interconnect resistance to avoid a current/voltage drop or the width of the BL or WL drives might need to be larger than the minimum required to drive the current. The minimum width allowed can be set based on a design rule manual (DRM) and it can be determined as a result of what, for example, a fabrication facility can manufacture.

To program the 1T OTP bitcell, a sufficient voltage/current can be applied to the polysilicon gate 204 to cause a rupture in the thin core gate oxide 102 to create a filament that provides a low resistance path through the thin core gate oxide 102 included in region 210. The filament can form right at the transition (e.g., the transition region 212) from the thin core gate oxide 102 to the thick IO gate oxide 104 or the filament can form in the thin core gate oxide 102 itself, as opposed to being formed in the transition region 212.

FIG. 2 further illustrates a width W of the one-finger diffusion region 202, which is covered by the polysilicon gate 204. Due to the voltage/current requirement to program the 1T OTP bitcell, the width W is much larger than the minimum allowed in the process. This is needed to allow for sufficient current to flow from the gate oxide rupture location through the channel of the transistor to a bit line 206 to form a permanent low resistance filament.

FIG. 3 illustrates an overhead view of a 1T OTP bitcell with a multi-finger diffusion region according to an embodiment of the present disclosure.

Specifically, FIG. 3 illustrates a 1T OTP anti-fuse bitcell 300 that is similar to FIG. 2 with respect to the polysilicon gate 204, the bit lines 206 and the regions 208, 210 and 212. Note that FIG. 1 can also be a cross-section taken from line C-C of FIG. 3.

The 1T OTP anti-fuse bitcell 300 is different from the 1T OTP anti-fuse bitcell of FIG. 2, in that the 1T OTP bitcell 300 includes a three-finger diffusion region 302 that includes (i) a first finger 304 (bottommost horizontal area of the three-finger diffusion region 302), (ii) a second finger 306 (middle horizontal area of the three-finger diffusion region 302) and (iii) a third finger 308 (uppermost horizontal area of the three-finger diffusion region 302). The first, second and third fingers 304, 306 and 308 can be formed by creating slots 303 in the diffusion region 302. The slots 303 can be formed by shallow trench isolation (STI) being cut into the diffusion (wafer surface) region 202. In this bitcell, the three fingers 304, 306, and 308 can be formed because of the space between multiple bitcells being larger than necessary (as discussed above), making it possible to turn one finger into three. The first, second and third fingers 304, 306 and 308 can also be referred to as sub-regions of the diffusion region 202. The diffusion region 202 is larger than what is actually required by the 1T OTP bitcell 300 to allow room in peripheral circuits for devices large enough to provide the necessary current during program to form a low resistance filament during rupture. Also, the 1T OTP bitcell 300 of FIG. 3 can be the same size as the 1T OTP bitcell 200 of FIG. 2 because the polysilicon gate 204 of the 1T OTP bitcell 200 of FIG. 2 has extra space to correctly pitch match to peripheral circuits and also to allow for large peripheral devices.

This three-finger diffusion region 302 structure results in the formation of three gate areas, a first gate area where the polysilicon gate 204 extends over the first finger 304 in the X and Y directions, as second gate area where the polysilicon gate 204 extends over the second finger 306 in the X and Y directions, and a third gate area where the polysilicon gate 204 extends over the third finger 308 in the X and Y directions. These three gate areas will become more apparent when viewing FIG. 5B.

Further, as illustrated in FIG. 3, a width W1 of the first finger 304, which is covered by the polysilicon gate 204, is less than the width W of the one-finger diffusion region 202 of FIG. 2, a width W2 of the second finger 306, which is covered by the polysilicon gate 204, is less than the width W of the one-finger diffusion region 202 of FIG. 2 and a width W3 of the third finger 308, which is covered by the polysilicon gate 204, is less than the width W of the one-finger diffusion region 202 of FIG. 2. The narrower widths W1, W2 and W3 (in contrast to the width W of the one-finger diffusion region 202) allow the (read) VT of the 1T OTP bitcell 300 to be less than the VT of the 1T OTP bitcell 200 of FIG. 2. As illustrated in FIG. 3, the width W1 of the first finger 304 and the width W3 of the third finger 308 are narrower than the width W2 of the second finger 306, and the width W2 of the second finger 306 is wide enough to allow enough current flow during rupture to properly form the low resistance filament (e.g., a high voltage ruptures or breaks down the thin gate oxide to form the low resistance filament). Further, the widths W1, W2 and W3 of the first, second and third fingers 304, 306 and 308 can be the same. Lengths of the first, second and third fingers 304, 306 and 308 and lengths of the slots 303 extend in the X direction and the widths of the first, second and third fingers 304, 306 and 308 and widths of the slots 303 extend in the Y direction, as illustrated in FIG. 3. The lengths of the slots 303 can be the same as, less than or more than the lengths of the defined first, second and third fingers 304, 306 and 308. Further, the widths of each of the slots 303 can be the same or they can be different from one another. Additionally, the widths of the slots 303 can be the same as, less than or more than any of the widths of the first, second and/or third fingers 304, 306 and 308. The width W1 of the first finger 304 can be the same as, less than or greater than the width W3 of the third finger 308. The first and third fingers 304 and 308 are narrow enough to allow for a lower voltage read and the second finger 306 is wider so as to provide a sufficient width W2 to allow for the current needed during programming to form the low resistance filament through the thin gate oxide during rupture.

The layout in FIG. 3 is likely to have some corner rounding causing the ends of the slots 303 to become rounded and shorter during manufacturing. The slots 303 can be extended to compensate for corner rounding.

The multi-finger diffusion region 302 can also include two fingers or four fingers. Additional fingers can be possible, depending upon the amount of space available, without deviating from the scope of the present disclosure. As similarly described above, a voltage threshold required to read data from the 1T OTP anti-fuse bitcell with two, three or four fingers, etc., is lower than a voltage threshold required to read data of a single-finger 1T OTP anti-fuse bitcell having a diffusion region with only one finger.

Figure 4:
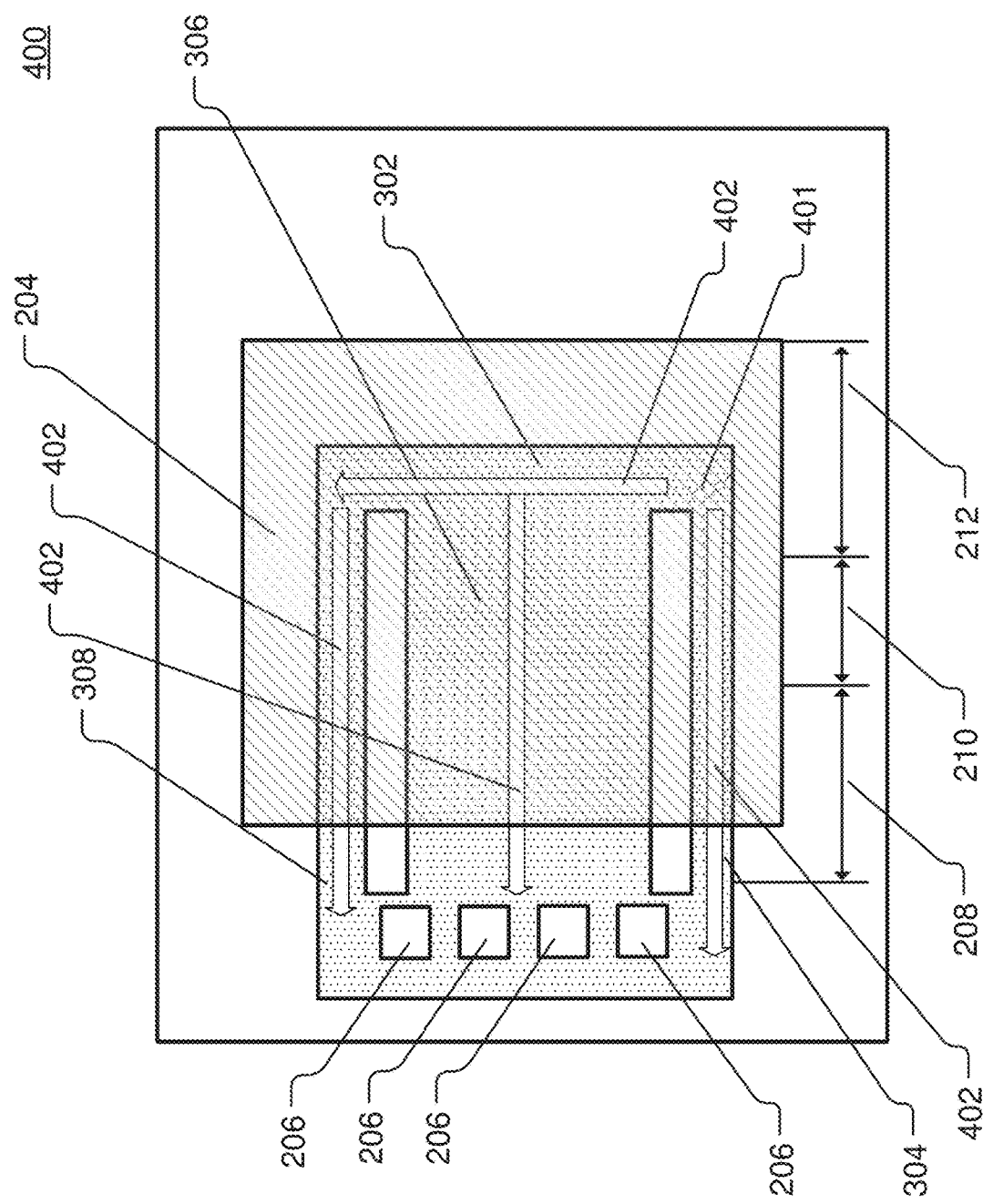
FIG. 4 illustrates an overhead view of a 1T OTP anti-fuse bitcell with a multi-finger diffusion region including example current flows according to an embodiment of the present disclosure.

FIG. 4 illustrates an overhead view of a 1T OTP bitcell with a three-finger diffusion region including example current flows according to an embodiment of the present disclosure. FIG. 4 includes arrows 402 to show a path of current flow if a filament were to form in the lower right corner of the 1T OTP bitcell 400.

Specifically, FIG. 4 illustrates a 1T OTP bitcell 400 that is the same as the 1T OTP bitcell 300 of FIG. 3, except that one possible rupture point 401 and current paths (arrows) 402 are illustrated. During programming of the 1T OTP bitcell 400, a voltage (e.g., a programming voltage) large enough to rupture the thin core gate oxide 104 (see FIG. 1) in region 212 is applied to the thin gate core oxide 104. The programming voltage is well above the VT of the thick gate device. FIG. 4 illustrates the rupture point as being near the first finger 304. As a result of the rupture at the rupture point 401 the first, second and third fingers 304, 306 and 308 are shorted to the thin gate oxide 104. The location of the rupture point 401 can be anywhere in regions 210 and 212. For the 1T OTP bitcell 400 to make use of all fingers 304, 306 and 308 when a small filament is formed in a random location in the thin gate oxide 104, all fingers 304, 306 and 308 must be shorted both at the side of the multi-finger diffusion region 302 where the BLs 206 are located and also in the thin gate core oxide 104. On the side where the BLs 206 are located the short can be with metal (e.g., metal contact). In the thin gate core oxide 104, the short can be in a diffusion under the polysilicon gate 204 or in a diffusion that extends out from under the polysilicon gate 204 and the short can be in a source/drain region.

Upon rupture at the rupture point 401, current will travel along current paths 402 along each of the first, second and third fingers 304, 306 and 308 to reach the metal contacts to the BLs 206. This provides three pathways between the rupture point 401 and the metal contacts along the first, second and third fingers 304, 306 and 308. The use of the first, second and third fingers 304, 306 and 308 ensures the entire width (e.g., widths W1, W2 and W3) of the 1T OTP bitcell 400 is used as a current path for programming and reading. When designing the 1T OTP bitcell 400 the layout may account for any process biases.

Due to some of the individual widths W1, W2 and W3 (see FIG. 3) being narrower than the width W (see FIG. 2), less gate voltage is required to perform a read operation then the 1T OTP bitcell 400 after it is programmed The 1T OTP bitcell 400 will use all three fingers 304, 306 and 308 to conduct current during programming where the polysilicon gate 204 is at a very high voltage. During a low voltage read the current will likely only flow through the narrow fingers 304 and 308 having a smallest width.

Figure 5A:
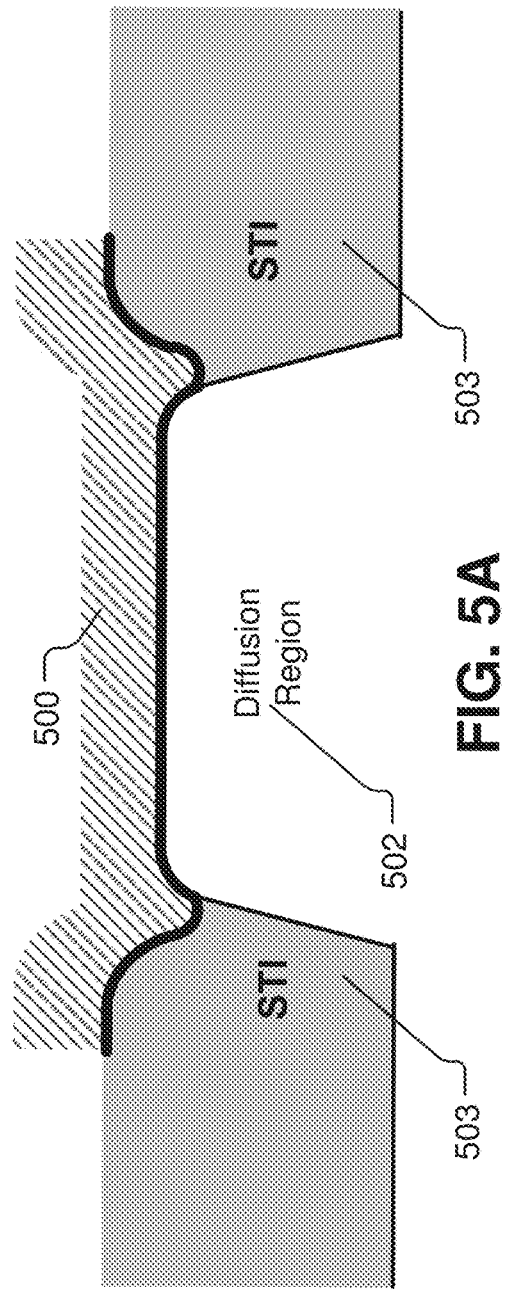
FIG. 5A illustrates a cross-sectional view along line B-B of FIG. 2 to illustrate the single-finger diffusion region of a 1T OTP anti-fuse bitcell.

FIG. 5A illustrates a cross-sectional view along line B-B of FIG. 2 to illustrate the single-finger diffusion region of a 1T OTP anti-fuse bitcell. Specifically, as illustrated in FIG. 5A, there is a one-finger diffusion region 502 below the polysilicon gate 500 and between two STI regions 503.

Figure 5B:
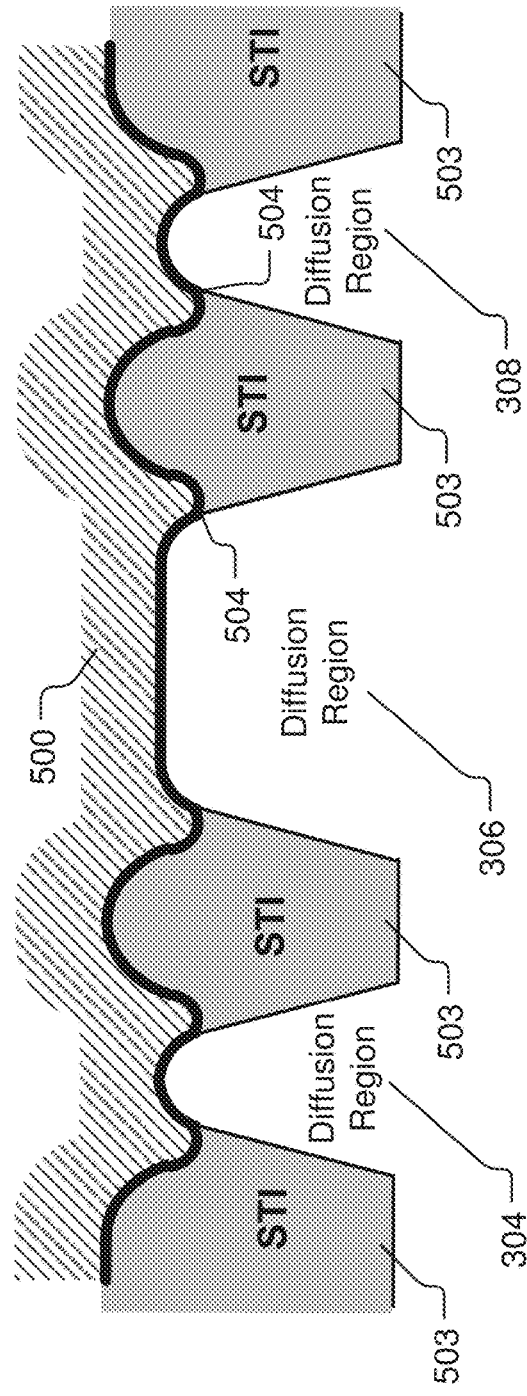
FIG. 5B illustrates a cross-sectional view along line D-D of FIG. 3 to illustrate the three-finger diffusion region of the 1T OTP anti-fuse bitcell according to an embodiment of the present disclosure.

FIG. 5B illustrates a cross-sectional view along line D-D of FIG. 3 to illustrate the three-finger diffusion region of the 1T OTP anti-fuse bitcell according to an embodiment of the present disclosure. Specifically, as illustrated in FIG. 5B, there are three diffusion regions, which may correspond to the first finger 304, the second finger 306 and the third finger 308 as discussed with reference to FIGS. 3 and 4. The three diffusion regions (i.e., the first, second and third fingers 304, 306 and 308) are formed by forming slots 303 (see FIG. 3) having a silicon wafer surface isolated with STI oxide (STI regions 503) between them.

The process of forming STI typically forms a small recess in the STI oxide next to the diffusion region. This recess allows the conductive gate material of the gate 500 to drop down around the edge of the small recess. This results in the gate 500 being on two sides of the diffusion region on the very edge of the small recess 504. This increases the electric field from the gate 500 to the nearest corner of the diffusion region. This increased electric field can occur even if there are no small recess 504, since there will still be electric fringing fields that extend from the polysilicon gate 204 over the STI to a sidewall of the diffusion area 308. This increased electric field reduces the VT of the three-finger 1T OTP bitcell in contrast to the one-finger 1T OTP bitcell.

Figure 6:
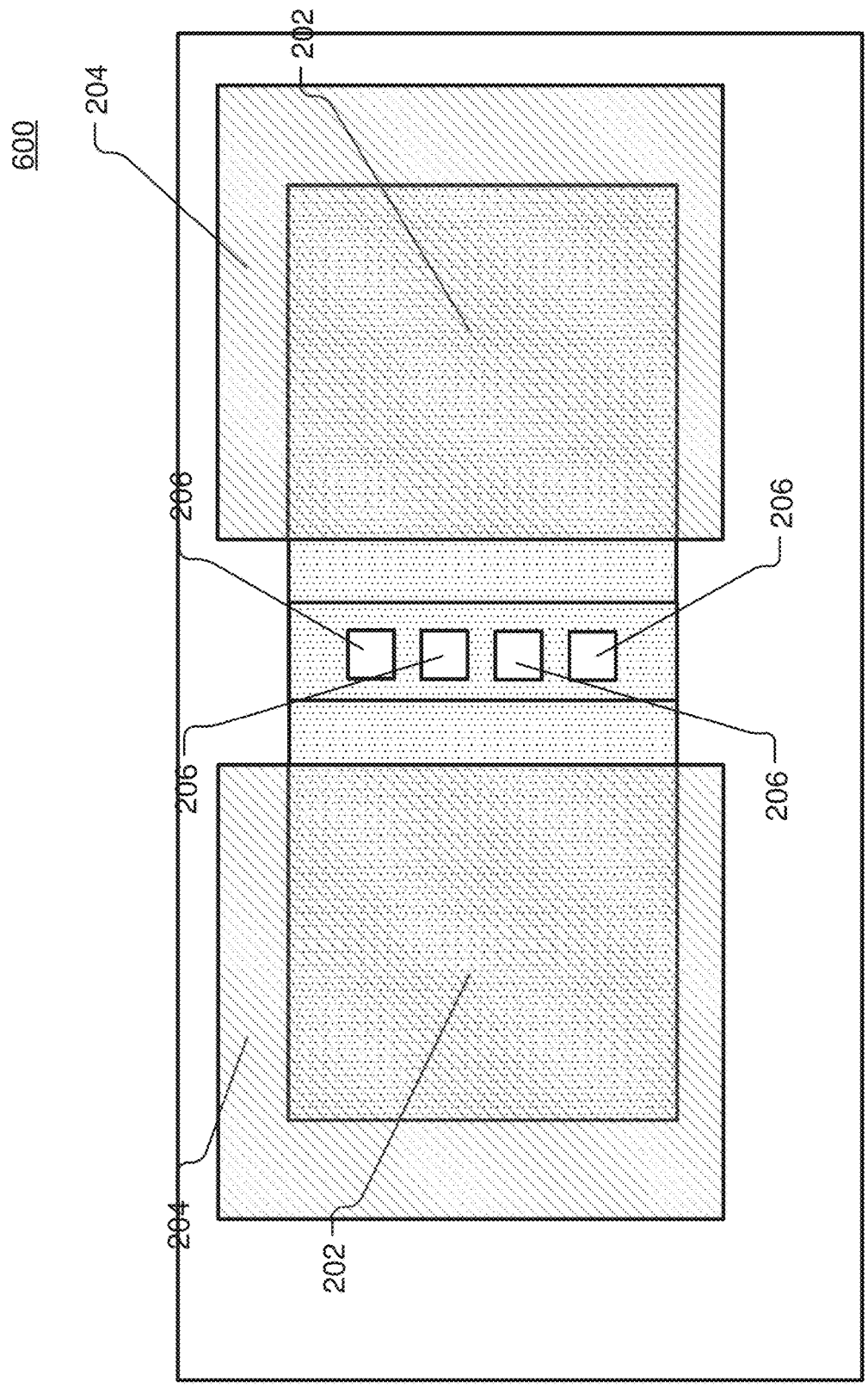
FIG. 6 illustrates two adjacent 1T OTP anti-fuse bitcells each having a single-finger diffusion region.

FIG. 6 illustrates two adjacent 1T OTP anti-fuse bitcells 600 each having a single-finger diffusion region. Specifically, the two adjacent 1T OTP anti-fuse bitcells can include the 1T OTP anti-fuse bitcell 200 structure illustrated in FIG. 2. The two adjacent 1T OTP bitcells 600 share the same BLs 206.

Figure 7:
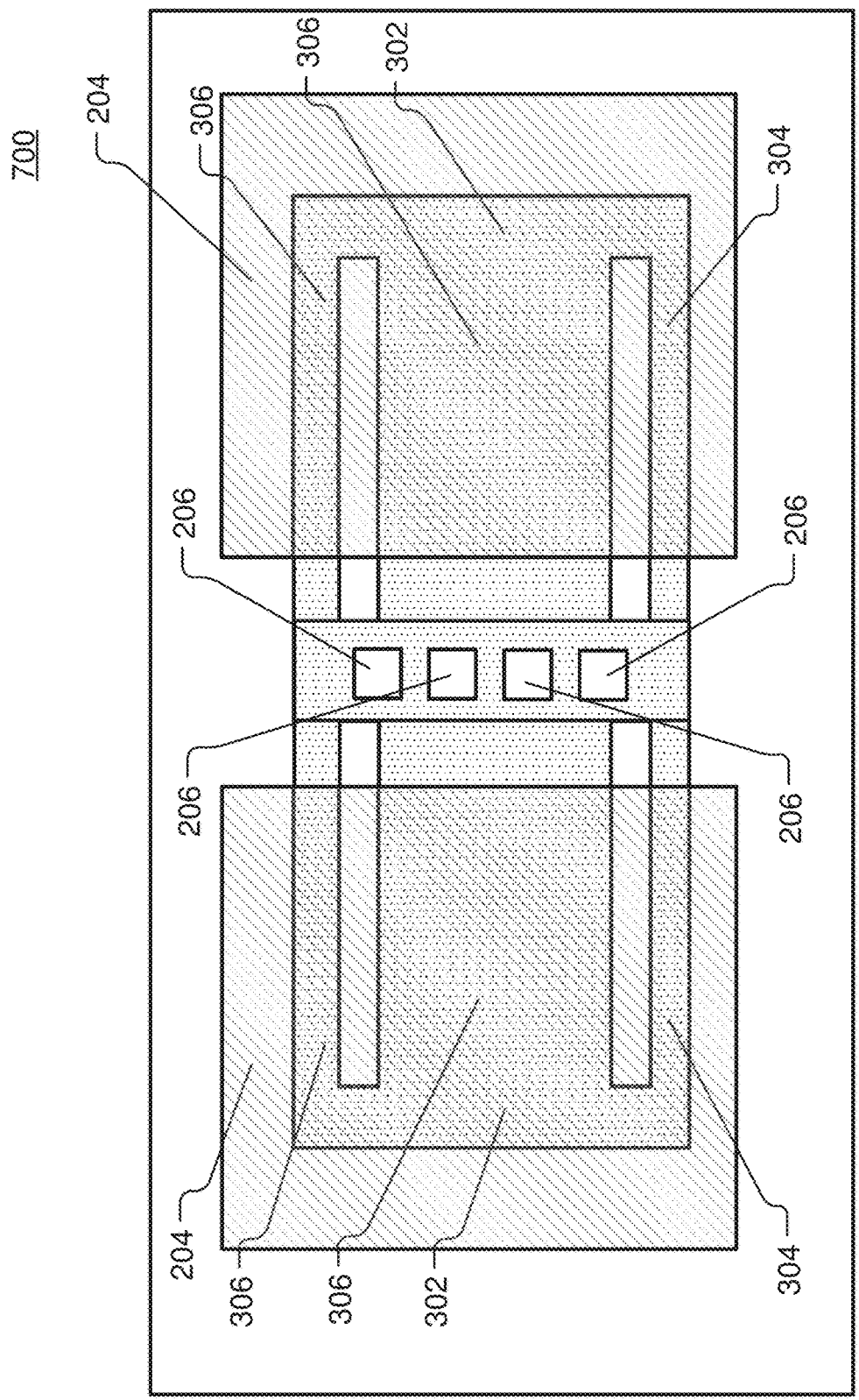
FIG. 7 illustrates two adjacent 1T OPT anti-fuse bitcells each having a three-finger diffusion region according to an embodiment of the present disclosure.

FIG. 7 illustrates two adjacent 1T OPT anti-fuse bitcells 700 each having a three-finger diffusion region according to an embodiment of the present disclosure. Specifically, the two adjacent 1T OPT anti-fuse bitcells can include the 1T OTP anti-fuse bitcell 300 structure illustrated in FIG. 3. The two adjacent 1T OTP bitcells 700 share the same BLs 206.

Figure 8:
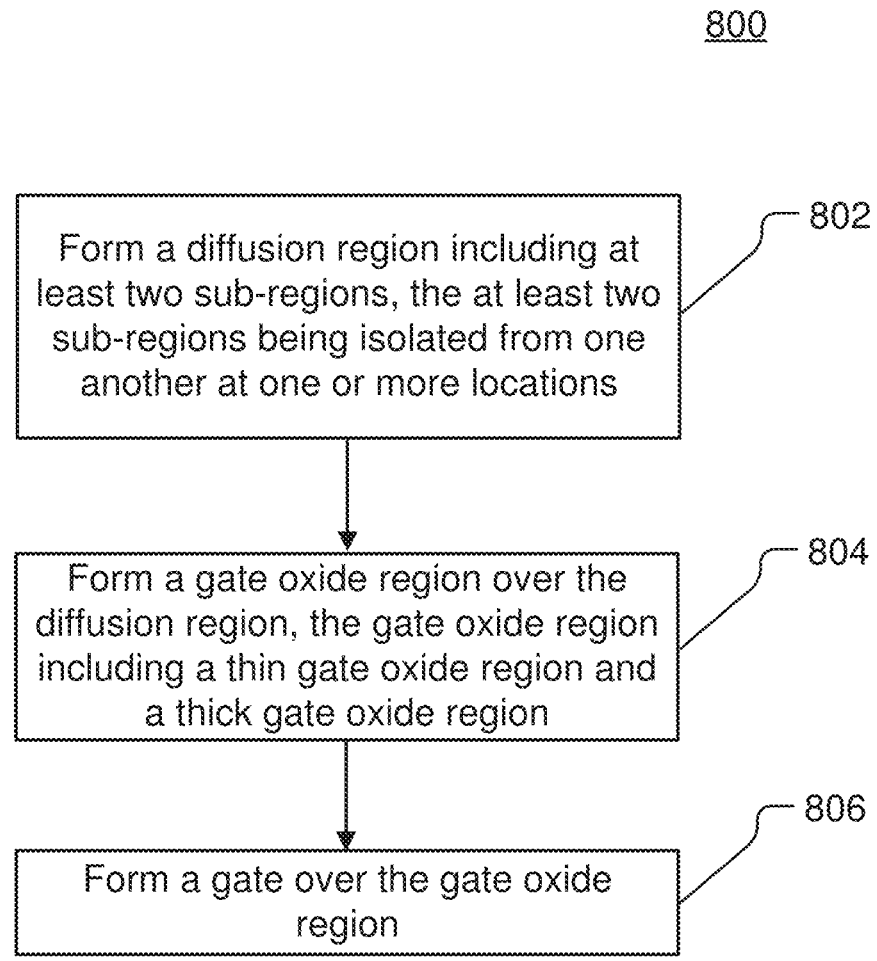
FIG. 8 illustrates a flowchart including various operations performed to manufacture a 1T OTP anti-fuse bitcell according to an embodiment of the present disclosure.

FIG. 8 illustrates a flowchart 800 including various operations performed to manufacture a 1T OTP anti-fuse bitcell according to an embodiment of the present disclosure.

Specifically, the flowchart 800 includes an operation 802 of forming a diffusion region including at least two sub-regions, the at least two sub-regions being isolated from one another at one or more locations.

The flowchart 800 also includes an operation 804 of forming a gate oxide region over the diffusion region, the gate oxide region including a thin gate oxide region and a thick gate oxide region.

Additionally, flowchart 800 includes an operation 806 of forming a gate over the gate oxide region.

Figure 9:
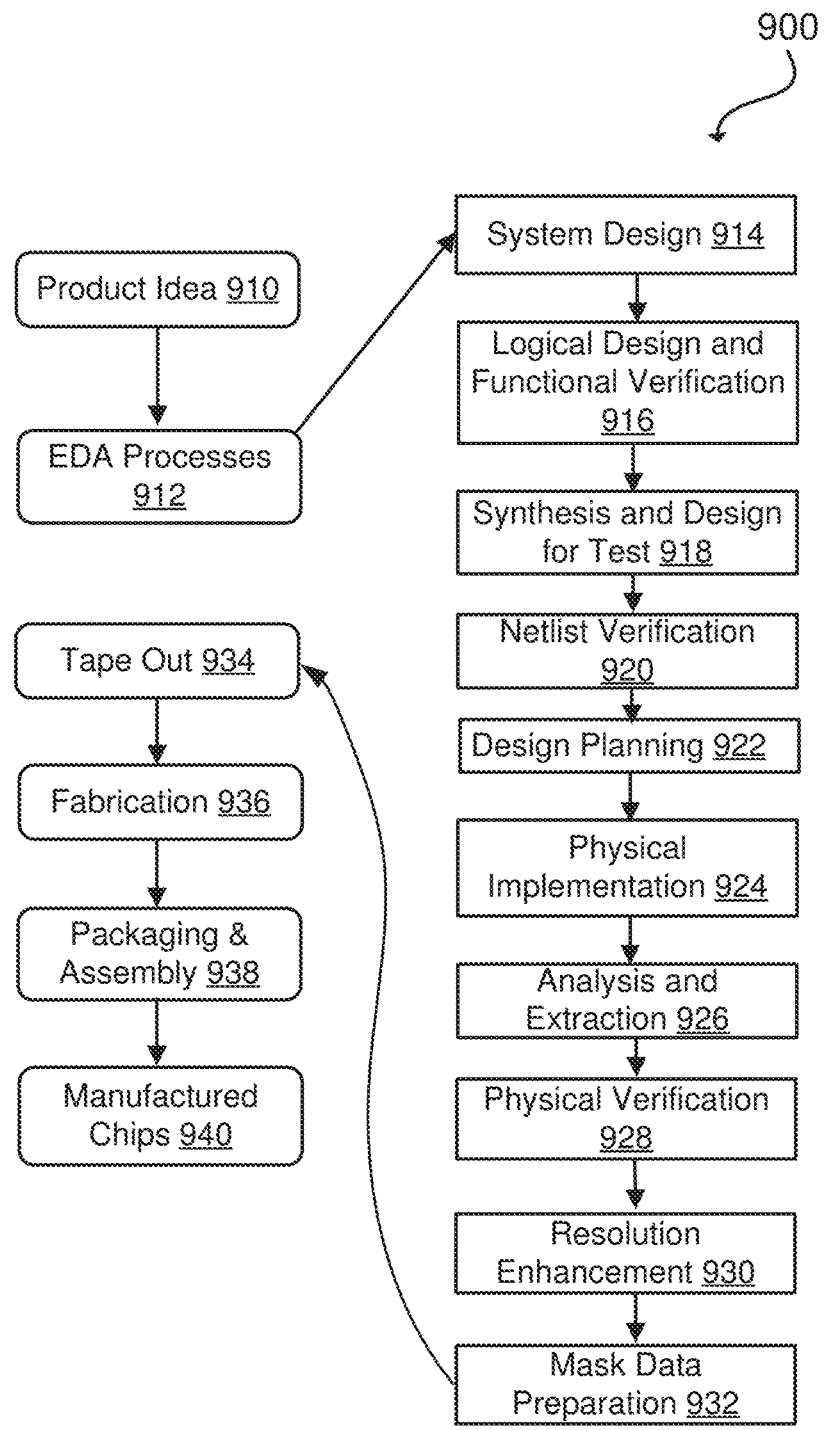
FIG. 9 depicts a flowchart of various processes used during the design and manufacture of an integrated circuit in accordance with some embodiments of the present disclosure.

FIG. 9 illustrates an example set of processes 900 used during the design, verification, and fabrication of an article of manufacture such as an integrated circuit (or an OTP bitcell, as described above) to transform and verify design data and instructions that represent the integrated circuit. Each of these processes can be structured and enabled as multiple modules or operations. The term 'EDA' signifies the term 'Electronic Design Automation.' These processes start with the creation of a product idea 910 with information supplied by a designer, information which is transformed to create an article of manufacture that uses a set of EDA processes 912. When the design is finalized, the design is taped-out 934, which is when artwork (e.g., geometric patterns) for the integrated circuit is sent to a fabrication facility to manufacture the mask set, which is then used to manufacture the integrated circuit. After tape-out, a semiconductor die is fabricated 936 and packaging and assembly processes 938 are performed to produce the finished integrated circuit 940.

Specifications for a circuit or electronic structure may range from low-level transistor material layouts to high-level description languages. A high-level of representation may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding tools of that layer (e.g., a formal verification tool). A design process may use a sequence depicted in FIG. 9. The processes described by be enabled by EDA products (or tools).

During system design 914, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 916, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 918, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 920, the netlist is checked for compliance with timing constraints and for correspondence with the HDL code. During design planning 922, an overall floor plan for the integrated circuit is constructed and analyzed for timing and top-level routing.

During layout or physical implementation 924, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 926, the circuit function is verified at the layout level, which permits refinement of the layout design. During physical verification 928, the layout design is checked to ensure that manufacturing constraints are correct, such as DRC constraints, electrical constraints, lithographic constraints, and that circuitry function matches the HDL design specification. During resolution enhancement 930, the geometry of the layout is transformed to improve how the circuit design is manufactured.

During tape-out, data is created to be used (after lithographic enhancements are applied if appropriate) for production of lithography masks. During mask data preparation 932, the 'tape-out' data is used to produce lithography masks that are used to produce finished integrated circuits.

A storage subsystem of a computer system (such as computer system 900 of FIG. 9) may be used to store the programs and data structures that are used by some or all of the EDA products described herein, and products used for development of cells for the library and for physical and logical design that use the library.

Figure 10:
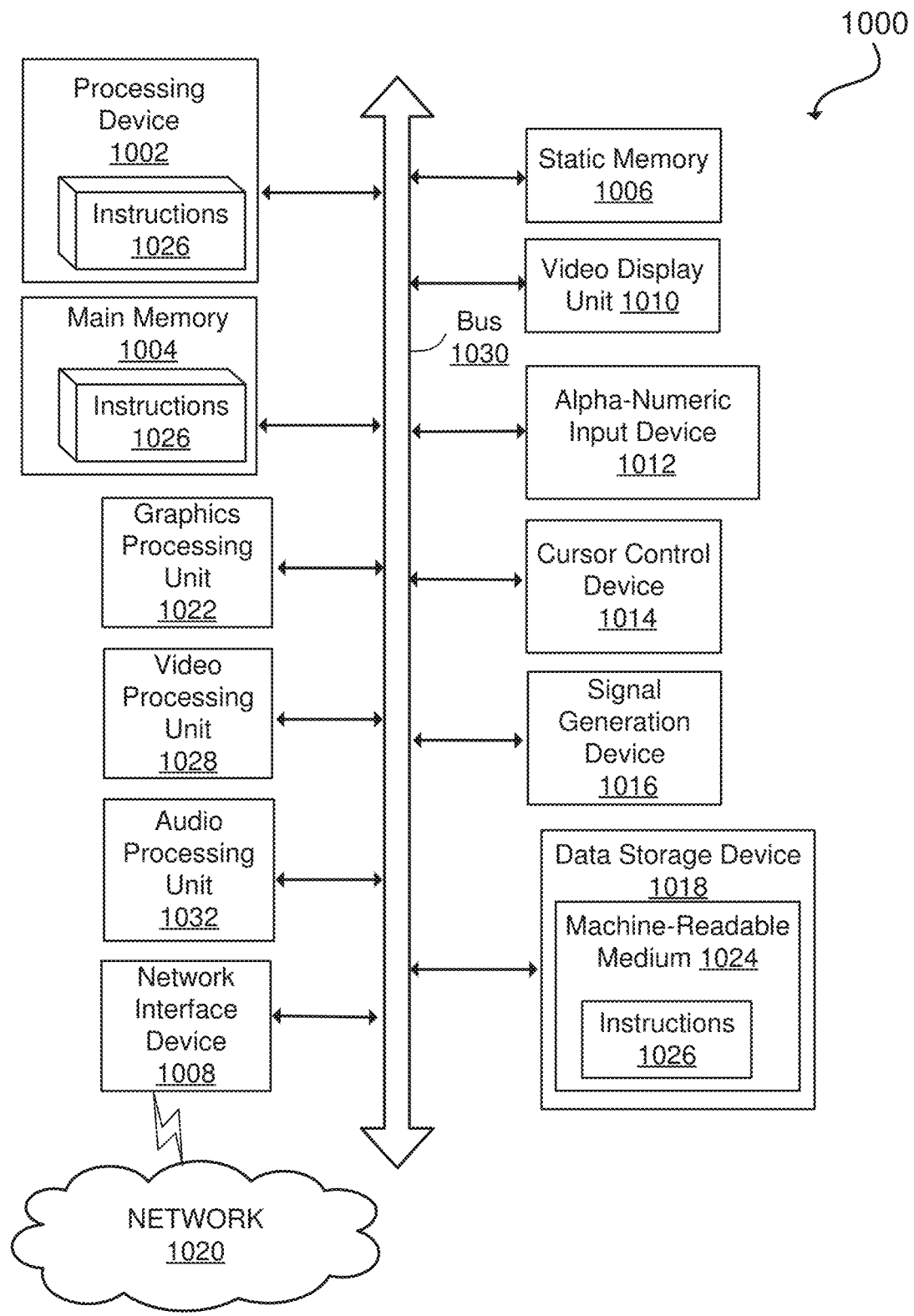
FIG. 10 depicts a diagram of an example computer system in which embodiments of the present disclosure may operate.

FIG. 10 illustrates an example machine of a computer system 1000 within which a set of instructions, for causing the machine to perform any one or more of the methodologies discussed herein, such as the manufacture of an OTP bitcell, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1000 includes a processing device 1002, a main memory 1004 (e.g., read-only memory (ROM), flash memory, dynamic random access memory (DRAM) such as synchronous DRAM (SDRAM), a static memory 1006 (e.g., flash memory, static random access memory (SRAM), etc.), and a data storage device 1018, which communicate with each other via a bus 1030.

Processing device 1002 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1002 may also be one or more special-purpose processing devices such as an application specific integrated circuit (ASIC), a field programmable gate array (FPGA), a digital signal processor (DSP), network processor, or the like. The processing device 1002 may be configured to execute instructions 1026 for performing the operations and steps described herein.

The computer system 1000 may further include a network interface device 1008 to communicate over the network 1020. The computer system 1000 also may include a video display unit 1010 (e.g., a liquid crystal display (LCD) or a cathode ray tube (CRT)), an alphanumeric input device 1012 (e.g., a keyboard), a cursor control device 1014 (e.g., a mouse), a graphics processing unit 1022, a signal generation device 1016 (e.g., a speaker), graphics processing unit 1022, video processing unit 1028, and audio processing unit 1032.

The data storage device 1018 may include a machine-readable storage medium 1024 (also known as a non-transitory computer-readable medium) on which is stored one or more sets of instructions 1026 or software embodying any one or more of the methodologies or functions described herein. The instructions 1026 may also reside, completely or at least partially, within the main memory 1004 and/or within the processing device 1002 during execution thereof by the computer system 1000, the main memory 1004 and the processing device 1002 also constituting machine-readable storage media.

In some implementations, the instructions 1026 include instructions to implement functionality corresponding to the present disclosure. While the machine-readable storage medium 1024 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1002 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A one-transistor (1T) one-time programmable (OTP) anti-fuse bitcell comprising:
    a gate;
    a diffusion region including at least two sub-regions, the at least two sub-regions being isolated from one another at one or more locations; and
    a gate oxide region located between the gate and the diffusion region, the gate oxide region including a first gate oxide region and a second gate oxide region, wherein the first gate oxide region has a thinner thickness than the second gate oxide region,
    wherein a width of a first sub-region of the at least two sub-regions is narrower than a width of a second sub-region of the at least two sub-regions.

2. The 1T OTP of claim 1, wherein each sub-region of the at least two sub-regions is shorted to the thin gate oxide region.

3. The 1T OTP anti-fuse bitcell of claim 1, wherein the 1T OTP anti-fuse bitcell is programmed by an application of a voltage sufficient to cause a rupture in the thin gate oxide region.

4. The 1T OTP anti-fuse bitcell of claim 3, wherein each sub-region of the at least two sub-regions is shorted to contact a bit line.

5. The 1T OTP anti-fuse bitcell of claim 1, wherein the at least two sub-regions of the diffusion region includes a third sub-region and wherein a width of the third sub-region is narrow enough to affect the threshold voltage of the 1T OTP anti-fuse bitcell during a read operation.

6. The 1T OTP anti-fuse bitcell of claim 1, wherein the at least two sub-regions of the diffusion region includes a third sub-region and wherein a width of the third sub-region is narrower than the width of the second sub-region.

7. The 1T OTP anti-fuse bitcell of claim 6, wherein the width of the first sub-region is the same as the width of the third sub-region and the width of each of the first and third sub-regions is less than the width of the second sub-region.

8. The 1T OTP anti-fuse bitcell of claim 6, wherein the 1T OTP anti-fuse bitcell is programmed by an application of a voltage sufficient to cause a rupture in the thin gate oxide region, such that each sub-region of the at least two sub-regions is shorted to the thin gate oxide region.

9. The 1T OTP anti-fuse bitcell of claim 8, wherein each sub-region of the at least two sub-regions is shorted to contact a bit line.

10. The 1T OTP anti-fuse bitcell of claim 1, wherein the at least two sub-regions are formed in the diffusion region by forming one or more slots in the diffusion region along a partial length of the diffusion region, such that a first slot is located and extends between lengths of the at least two sub-regions.

11. The 1T OTP anti-fuse bitcell of claim 10, wherein the at least two sub-regions includes three sub-regions, the one or more slots includes first and second slots, and a width of at least one of the first and second slots is wider than a width of at least one of the three sub-regions.

12. The 1T OTP anti-fuse bitcell of claim 10, wherein the at least two sub-regions includes three sub-regions, the one or more slots includes first and second slots, and a length of at least one of the first and second slots is the same as a length of at least one of the three sub-regions.

13. The 1T OTP anti-fuse bitcell of claim 1, wherein a total combined width of the at least two sub-regions is sufficient to provide enough current during a rupture of the thin gate oxide region to form a permanent low resistance filament therein.

14. The 1T OTP anti-fuse bitcell of claim 1, wherein first and second sub-regions of the at least two sub-regions are formed in the diffusion region by forming a slot in the diffusion region along a partial length of the diffusion region, such that the slot is located and extends between lengths of the first and second sub-regions.

15. The 1T OTP anti-fuse bitcell of claim 14, wherein a width of the slot is wider than a width of the first sub-region.

16. The 1T OTP anti-fuse bitcell of claim 14, wherein a length of the slot is the same as a length of at least one of the first and second sub-regions.

17. A bipolar complementary metal-oxide-semiconductor double-diffused metal-oxide-semiconductor (BCD) chip comprising:

a row of one-transistor (1T) one-time programmable (OTP) anti-fuse bitcells, each pair of 1T OTP anti-fuse bitcells of the row sharing a common bitline, and each 1T OTP anti-fuse bitcell of the row comprising:
  a gate;
  a diffusion region including at least two sub-regions, the at least two sub-regions being isolated from one another at one or more locations; and
  a gate oxide region located between the gate and the diffusion region, the gate oxide region including a thin gate oxide region and a thick gate oxide region,
  wherein the at least two sub-regions are formed in the diffusion region by forming one or more slots in the diffusion region along a partial length of the diffusion region, such that a first slot is located and extends between lengths of the at least two sub-regions and such that the first slot is surrounded, on at least four sides, by the at least two sub-regions, and
  wherein a second slot of the formed one or more slots is located and extends between lengths of the at least two sub-regions, such that the second slot is surrounded, on at least four sides, by the at least two sub-regions.

18. The BCD chip of claim 17, wherein, for each respective 1T OTP anti-fuse bitcell of the row, a width of a first sub-region of the at least two sub-regions is narrower than a width of a second sub-region of the at least two sub-regions.

19. A method of manufacturing a one-transistor (1T) one-time programmable (OTP) anti-fuse bitcell, the method comprising:
  forming a diffusion region including at least two sub-regions, the at least two sub-regions being isolated from one another at one or more locations;
  forming a gate oxide region over the diffusion region, the gate oxide region including a thin gate oxide region and a thick gate oxide region; and
  forming a gate over the gate oxide region,
  wherein a width of a first sub-region of the at least two sub-regions is narrower than a width of a second sub-region of the at least two sub-regions.

* * * * *